(12) United States Patent
Taguchi (10) Patent No.: US 7,269,051 B2
(45) Date of Patent: Sep. 11, 2007

(54) INSPECTION METHOD OF ARRAY BOARD AND INSPECTION EQUIPMENT THEREOF

(75) Inventor: Tomoyuki Taguchi, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/297,305

(22) Filed: Dec. 8, 2005

(65) Prior Publication Data

US 2006/0164118 A1  Jul. 27, 2006

(30) Foreign Application Priority Data

Dec. 15, 2004  (JP)  ............................... 2004-363063

(51) Int. Cl.
*G11C 11/24* (2006.01)

(52) U.S. Cl. .................. 365/149; 365/104; 365/230.06

(58) Field of Classification Search ................ 365/149, 365/104, 230.06, 189.09; 345/204, 92
See application file for complete search history.

(56) References Cited

U.S. PATENT DOCUMENTS 7,133,035 B2 * 11/2006 Kim et al. .................. 345/204
2005/0104830 A1 * 5/2005 Kogure et al. ................ 345/92

* cited by examiner

*Primary Examiner*—Anh Phung
*Assistant Examiner*—Dang Nguyen
(74) *Attorney, Agent, or Firm*—James R. Nock (57) ABSTRACT

The present invention provides an inspection method of an array board and an inspection equipment thereof, which can detect a disconnection failure of a gate line even if electric potentials are applied from both ends of the gate line.

10 Claims, 4 Drawing Sheets

INSPECTION METHOD OF ARRAY BOARD AND INSPECTION EQUIPMENT THEREOF

FIELD OF THE INVENTION

The present invention relates to an inspection method of an array board and an inspection equipment thereof, and more specifically, relates to an inspection method of an array board used as a liquid crystal panel and as an organic electro luminescence panel or the like.

BACKGROUND OF THE INVENTION

Figure 5:
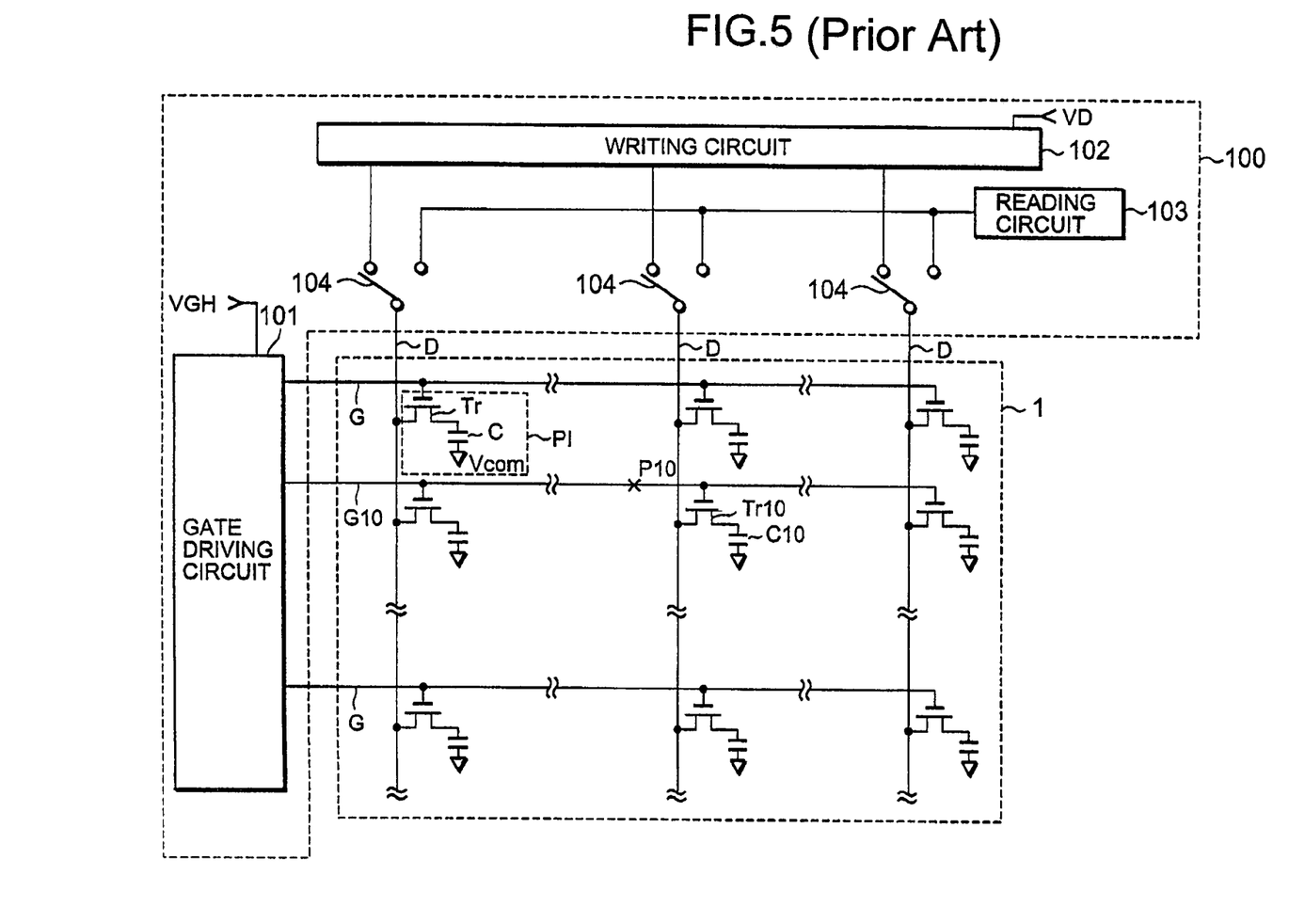
FIG. 5 (Prior Art) is a circuit diagram showing the structures of a conventional array board and a conventional inspection equipment.

As shown in FIG. 5, an array board 1 to be used as the liquid panel is provided with a plurality of gate lines G arrayed in rows, a plurality of signal lines D arrayed in columns, and a plurality of pixels PI each of which is arranged at the intersections of the gate lines G with the signal lines D. The pixels PI include switching transistors (thin film transistors) Tr, retention capacitors C, and pixel electrodes (not illustrated).

If the switching transistors Tr are turned on, a writing electric potential VD from the signal lines D is inputted in the pixel electrode and the one end of the retention capacitor C. A common electric potential Vcom is inputted in the opposed electrode (not illustrated) arranged opposite to the pixel electrode and at the other end of the retention capacitors C so as to drive a liquid crystal element (not illustrated) located between the pixel electrode and the opposed electrode due to a difference in the electric potential of the pixel electrode and the opposed electrode. The retention capacitors C retain an electric potential that is applied between the pixel electrode and the opposed electrode for a predetermined period of time.

In the array step of manufacturing such an array board 1, with or without of a failure such as a pixel failure and a disconnection failure of the gate line G is inspected. These inspections are carried out by an inspection equipment 100 shown in FIG. 5. The inspection equipment 100 is provided with a gate driving circuit 101 for turning on the switching transistors Tr by applying a driving electric potential VGH to the one end of the gate line G, a writing circuit 102 for applying the writing electric potential VD in the signal line D, a reading circuit 103 for reading the electric charge quantity stored in the retention capacitor C, and a switching element 104 for connecting the signal line D to the writing circuit 102 or the reading circuit 103.

The inspection equipment 100 writes the electric charge in the retention capacitor C (the writing operation), and by reading the written electric charge (the reading operation), the inspection equipment 100 inspects to see if there is a failure. According to the writing operation, the gate line G applies the driving electric potential VGH to the selected gate line G and turns on the switching transistor Tr connected to the selected gate line G during a period of time of writing. In addition, the writing circuit 102 is connected to the signal line D that is selected by the switching element 104 and the writing circuit 102 applies the writing electric potential VD to the signal line D. Thereby, the electric charge is stored in the retention capacitor C within the pixel PI arranged at the intersection of the selected gate line G with the selected signal line D. After the writing operation, the gate driving circuit 101 stops applying of the driving electric potential VGH and the writing circuit 102 stops applying of the writing electric potential VD. Subsequently, the inspection equipment 100 starts the reading operation.

According to the reading operation, the gate driving circuit 101 turns on the switching transistor Tr again. In this time, the reading circuit 103 is connected to the selected signal line D through the switching element 104 and reads out the electric charge stored in the retention capacitor C upon the writing operation. On the basis of the read electric charge quantity, it is determined if a failure has occurred.

The pixel failure is determined based on whether or not the read electric charge quantity is equal to the electric charge quantity on a normal case that was measured in advance. On the other hand, the disconnection failure of the gate line G is determined based on whether or not the read electric charge quantity is 0. When the gate line G10 shown in FIG. 5 is disconnected at a point P10 between the gate driving circuit 101 and the switching transistor Tr10, even if the gate driving circuit 101 applies the driving electric potential VGH to the gate line G10, the electric potential VGH is not applied to the gate of the switching transistor Tr10. Therefore, even during the writing operation, the switching transistor Tr10 is not turned on, and the electric charge is not stored in a retention capacitor C10. In this case, it is determined that the gate line G10 is disconnected because the electric charge quantity that is read by the reading operation becomes 0.

In the meantime, in recent years, the liquid crystal panel has been made in a large size (e.g., one over 35 inches has been manufactured). The liquid crystal panel over 35 inches is applied with the driving electric potential VGH from the both sides of the gate line so as to drive the liquid crystal element. Since the gate line of the liquid crystal panel of a large size is longer than the conventional one, a resistance and a parasitic capacitance of the gate line are large. Therefore, if the driving electric potential is applied to the liquid crystal panel only from the one end of the gate line, a time that the electric potential gradually rises up to the driving electric potential from the one end to which the driving electric potential is applied to the other end thereof. In order to such a delay of the signal, the driving electric potentials are applied from the both ends of the gate line.

If the driving electric potentials are applied from the both ends of the gate line in a finished liquid crystal panel, even in the inspection of the pixel failure in the array step, it is necessary to apply the driving electric potentials from the both ends of the gate line. In the case of effecting an image inspection of the array board 1 of the large size by using the inspection equipment 100, the driving electric potential is applied only from the one end of the gate line G. In this case, the electric charge quantity to be stored in the retention capacitor upon the writing operation is decreased as the retention capacitor is located farther from the gate driving circuit 101 due to delay of the signal.

Therefore, even if the pixel is normal, the electric charge quantity stored in a time of period of writing is decreased, and there is a possibility that this normal pixel is determined as the pixel failure. If the writing time is made longer than the conventional case, this problem is solved, however, in this case, a property failure of the switching transistor Tr may not be detected. At last, it is necessary to effect the inspection of the pixel failure by applying the driving electric potentials from the both ends of the gate line.

However, if the driving electric potentials are applied from the both ends of the gate line, it is not possible to detect the disconnection failure of the gate line. This is because, if applying the driving electric potential VGH from the opposite ends of the gate line G10 in FIG. 5, even if the gate line is disconnected at the point P10, all switching transistors Tr connected to the gate line G10 are turned on and the electric charge in stored in each retention capacitor C.

In the image inspection, a method of applying the driving electric potentials to the both ends of the gate line is also available, and in the inspection of the disconnection failure of the gate line, a method of applying the driving electric potential only to the one end of the gate line is also available. However, in this case, a probe that is connected to the one end of the gate line should be detached upon the inspection of the disconnection failure, so that workload is increased. In addition, it is also available to inspect the disconnection failure by applying the driving electric potential from the one probe without detaching the probe, connecting an electric current detecting circuit to the other probe, and measuring the electric current flowing through the gate line. However, in this case, a switching circuit for switching the connection of the probe from the gate driving circuit into the electric current detecting circuit is required. There are about 1,000 pieces of the gate lines G on the array board 1, therefore, it is difficult to mount the switching circuit to accommodate all of these gate lines.

SUMMARY OF THE INVENTION

The invention provides an inspection method of an array board and an inspection equipment thereof, which can detect a disconnection failure of a gate line even if electric potentials are applied from both ends of the gate line.

According to the present invention, an inspection method of an array board which includes a plurality of gate lines arrayed in rows, a plurality of signal lines arrayed in columns and a plurality of pixels each of which is arranged at the intersections of the gate lines with the signal lines, the pixels including switching transistors having control terminals connected to the gate lines and continuity terminals of one side connected to the signal lines, and retention capacitors connected to the continuity terminals of the other side of the switching transistors, the inspection method of the array board may comprise the steps of selecting a signal line out of a plurality of the signal lines; applying a writing electric potential to the selected signal line; selecting a gate line out of a plurality of the gate lines; turning on the switching transistor arranged at the intersection of the selected signal line with the selected gate line, by applying a first electric potential to the one end of the selected gate line and applying a second electric potential being lower than the first electric potential to the other end of the selected gate line; measuring the electric charge quantity stored in the retention capacitor through the selected signal line, and determining a disconnection failure of the selected gate line on the basis of the measured electric charge quantity.

In the inspection method of an array board according to the invention, a first electric potential is applied to the one end of the selected gate line, and a second electric potential being lower than the first electric potential is applied to the other end.

In this case, if the gate line is not disconnected, the electric potential of the gate line is gradually decreased from the end to which the first electric potential is applied to the end to which the second electric potential is applied.

Consequently, the electric potentials stored in the retention capacitors in a plurality of pixels connected to the gate lines are gradually reduced from the retention capacitor arranged at the end side to which the first electric potential is applied to the retention capacitor arranged at the end side to which the second electric potential is applied. On the other hand, if the gate line is disconnected, the electric potential of the gate line becomes the first electric potential in the range from the end to which the first electric potential is applied to the disconnection part, and becomes the second electric potential in the range from the disconnection part to the end to which the second electric potential is applied.

Therefore, the electric charge quantity stored in each retention capacitor is different bordered by the disconnection part.

Specifically, the electric charge quantity of each retention capacitor arranged from the end to which the first electric potential is applied to the disconnection part is larger than the electric charge quantity of each retention capacitor arranged from the disconnection part to the end to which the second electric potential is applied. Furthermore, the electric charge quantity of each retention capacitor arranged from the end to which the first electric potential is applied to the disconnection part is equivalent, and the electric charge quantity of each retention capacitor arranged from the disconnection part to the end to which the second electric potential is applied is also equivalent. Therefore, if the electric charge quantity stored in each retention capacitor is measured, it is possible to inspect whether or not a disconnection failure has occurred.

It is preferable that the step of determining determines the disconnection failure by comparing the measured electric charge quantity to the normal electric charge quantity that was measured in advance on the array board without the disconnection of the gate line.

In this case, if the measured electric charge quantity is equal to the normal electric charge quantity that was measured in advance on the array board of which gate line is not disconnected, it can be determined that the disconnection failure is not generated. Therefore, if measuring the electric charge quantity of the retention capacitor corresponding to the same arrangement position as the retention capacitor that measured the normal electric charge quantity and comparing the measured electric charge quantity to the normal electric charge quantity, it is possible to determine the disconnection failure. Therefore, if the electric charge quantity of at least one retention capacitor that is connected to each gate line is measured, the disconnection failure of each gate line can be determined.

It is preferable that the step of determining determines that the disconnection failure is generated at any part at the side of the end to which the second electric potential is applied rather than the side near the selected signal line in the selected gate line when the measured electric charge quantity is higher than the normal electric charge quantity; and the disconnection failure is generated at any part at the side of the end to which the first electric potential is applied rather than the side near the selected signal line in the selected gate line when the measured electric charge quantity is lower than the normal electric charge quantity.

In this case, the retention capacitor measuring the electric charge quantity is specified by the selected gate line or the selected signal line, however, if the arrangement position of the specified retention capacitor is located nearer to the end side where the first electric charge is applied rather than the disconnection part, the measured electric charge quantity is higher than the normal electric charge quantity. On the other hand, if the arrangement position of the specified retention capacitor is located nearer to the end side where the second electric charge is applied rather than the disconnection part, the measured electric charge quantity is lower than the normal electric charge quantity. Therefore, if each gate line measures the electric charge quantity of at least one retention capacitor by each gate line, it is possible not only to determine the disconnection failure of this gate line but also to specify the disconnection part if the gate line is disconnected to some degree.

It is preferable that the step of selecting the signal line selects a signal line arranged at a center from among the plurality of signal lines.

In the retention capacitor that is specified by the signal line arrayed in a center part among a plurality of retention capacitors connected to the gate lines, a difference between the electric charge quantity without disconnection (namely, the normal electric charge quantity) and that the electric charge quantity with disconnection is largest. Therefore, it is easy to determine the disconnection failure of the gate line.

Preferably, the inspection method of the array board according to the present invention may comprise the steps of selecting a signal line from among the plurality of signal lines; applying a writing electric potential to the selected signal line during a period of time of writing; turning on a switching transistor arranged at the intersection of the selected gate line with the selected signal line by applying the same electric potentials to the both ends of the gate line selected from among the plurality of gate lines during the period of time of writing; turning on the switching transistor again during a period of time of reading and measuring the electric charge quantity stored in the retention capacitor through the selected signal line; and determining a pixel failure on the basis of the measured electric charge quantity.

In this case, if the same electric charges are applied to the both ends of the gate line during the period of time of writing, it is possible to inspect the pixel failure.

According to the present invention, an inspection equipment of an array board which includes a plurality of gate lines arrayed in rows, a plurality of signal lines arrayed in columns and a plurality of pixels each of which is arranged at the intersections of the gate lines with the signal lines, the pixels including switching transistors having control terminals connected to the gate lines and continuity terminals of one side connected to the signal lines, and retention capacitors connected to continuity terminals of the other side of the switching transistors, the inspection equipment of an array board may comprise a writing means for selecting a signal line out of a plurality of the signal lines and applying a writing electric potential to the selected signal line; a driving means for selecting a gate line out of a plurality of the gate lines and applying an electric potential to the selected gate line, and thereby turning on the switching transistor arranged at the intersection of the selected gate line with the selected signal line; an electric charge quantity measuring means for measuring the electric charge quantity stored in the retention capacitor through the selected signal line, and a determining means for determining a disconnection failure of the selected gate line on the basis of the measured electric charge quantity, the driving means including: a first gate driving unit for applying a first electric potential to the one end of the selected gate line, and a second gate driving unit for applying a second electric potential being lower than the first electric potential to the other end of the selected gate line.

It is preferable that the driving means further comprises a selecting unit for selecting the electric potential applied from the second driving means to the other end of the selected gate line from among the first and second electric potentials; and the determining means further determines a pixel failure on the basis of the measured electric charge quantity when the selecting means selects the first electric potential.

PREFERRED EMBODIMENT OF THE INVENTION

Hereinafter, with reference to the drawings, the embodiment(s) of the present invention will be described in detail. The same or corresponding parts in the drawings are given the same reference numerals and remarks and the explanation thereof is omitted.

Figure 1:
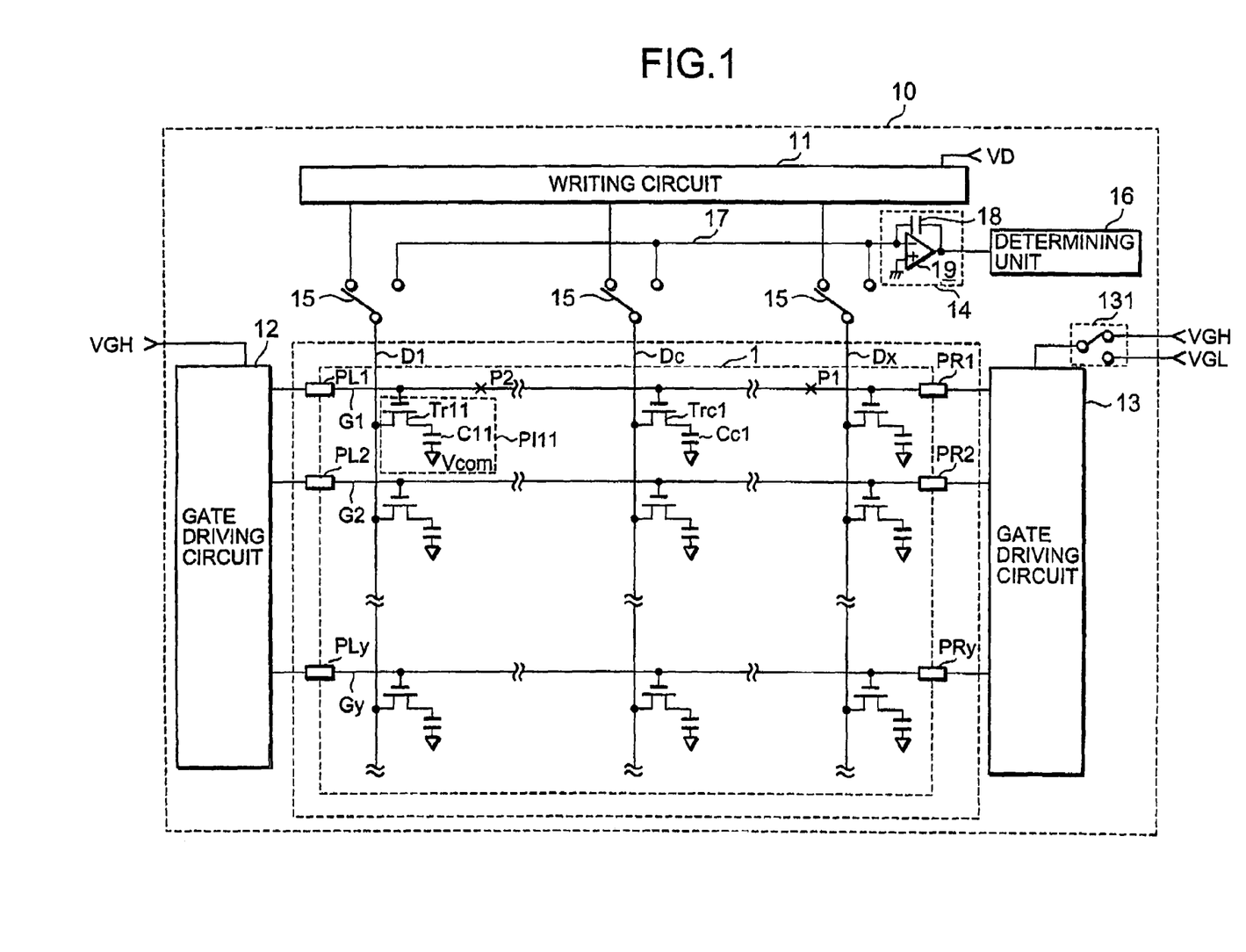
FIG. 1 is a circuit diagram illustrating the structures of an array board as an inspection target of an inspection method and an inspection equipment thereof according to an embodiment of the present invention.

With reference to FIG. 1, the array board 1 is provided with a plurality of gate lines G1 to Gy (y is a natural integer) arrayed in rows, a plurality of signal lines D1 to Dx (x is a natural integer) arrayed in columns and a plurality of pixels PI each of which is arranged at the intersections of the gate lines G1 to Gy with the signal lines D1 to Dx. In the present specification, the pixel arranged at the intersection of the gate line Gy with the signal line Dx is called as PIxy. At the one ends of the gate lines G1 to Gy, pads PL1 to PLy are connected and at the other ends thereof, pads PR1 to PRy are connected.

The pixel PIxy may include a switching transistor Trxy, a retention capacitor Cxy, and a pixel electrode (not illustrated). The switching transistor Trxy is constituted by an N channel type thin film transistor (TFT) and the gate of the switching transistor Trxy is connected to the corresponding gate line Gy and the source thereof is connected to the corresponding signal line Dx. The one end of the retention capacitor Cxy is connected to a source/drain of the corresponding switching transistor and the other end thereof is connected to a common electric potential line (not illustrated) to which the common electric potential Vcom is applied. By driving the selected gate line Gy and signal line Dx, it is possible to operate an arbitrary pixel PIxy.

In order to inspect this array board 1, an inspection equipment 10 is connected thereto. The inspection equipment 10 may include a writing circuit 11, gate driving circuits 12 and 13, a selecting circuit 131, an electric charge quantity measuring circuit 14, a switching element 15, and a determining unit 16.

The writing circuit 11 is connected to the signal line Dx that is selected by the switching element 15 to apply the writing electric potential VD to a signal line DX during the period of time of writing.

The gate driving circuits 12 and 13 may turn on the switching transistor Trxy within the pixel PIxy that is connected to the gate line Gy by applying different electric potentials to the both ends of the selected gate line Gy during the period of time of writing or during the period of time of reading. The gate driving circuit 12 is connected to the pads PL1 to Ply to apply the driving electric potential VGH to the selected gate line Gy. On the other hand, the gate driving circuit 13 is connected to the pads PR1 to PRy and when the selecting circuit 131 selects a retention electric potential VGL that is lower than the driving electric potential VGH, the gate driving circuit 13 may apply the retention electric potential VGL to the gate line Gy during the period of time of writing.

The electric charge quantity measuring circuit 14 is connected to the signal line Dx selected through a wiring for reading 17 to measure the electric charge quantity stored in the retention capacitor Cxy within the pixel PIxy during the period of time of writing. The electric charge quantity measuring circuit 14 is an integrating circuit and it may include a differential amplifier circuit 19 and an integrating capacity 18. The determining unit 16 receives the output of the electric charge quantity measuring circuit 14 to determine the disconnection failure and the pixel failure of the gate line.

Next, an inspection method of the disconnection failure of the gate line will be described below. This inspection method may include the writing operation for writing the electric charge in the retention capacitor Cxy in the pixel PIxy, the reading operation for reading the written electric charge, and the determining operation for determining the disconnection failure on the basis of the read electric charge. According to the inspection method using the inspection equipment 10, it is possible to easily determine the disconnection failure by applying the different electric potentials from the both ends of the gate line. The details of this will be explained below.

Figure 2:
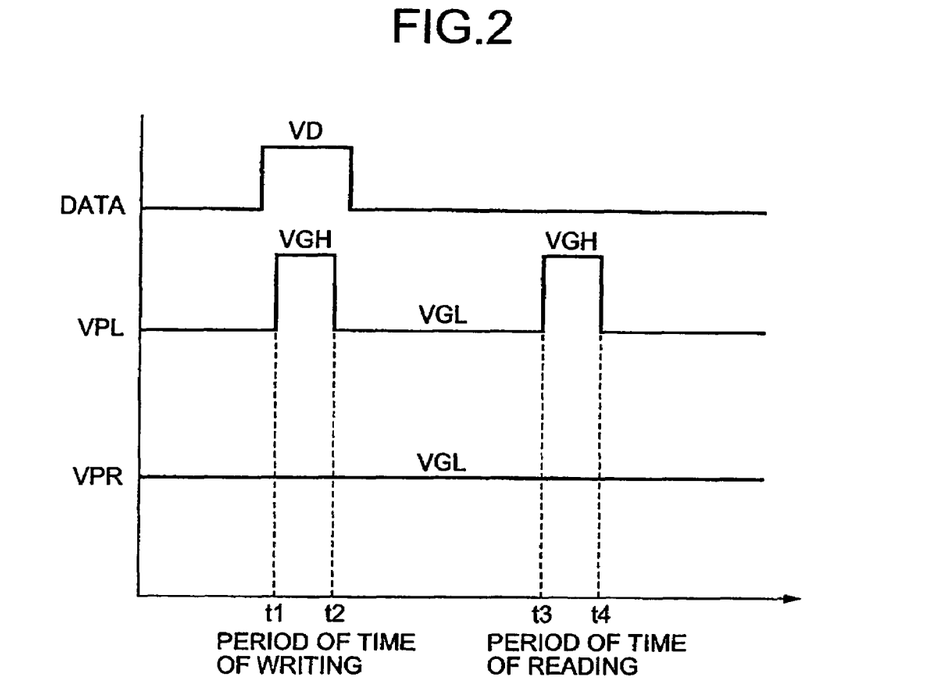
FIG. 2 is a timing chart showing the operation when the disconnection failure of a gate line is inspected by using the inspection equipment shown in FIG. 1.

With reference to FIG. 2, at first, the writing circuit 11 may select a signal line Dc that is arranged at a center from among the plurality of signal lines D1 to Dx. In this time, the writing circuit 11 may instruct the switching element 15 corresponding to the signal line Dc to connect the signal line Dc to the writing circuit 11. The writing circuit 11 is connected to the signal line Dc, and then, the writing circuit 11 may apply the writing electric potential DV to the signal line Dc to rise up the electric potential DATA of the signal line Dc to the writing electric potential VD.

Figure 3:
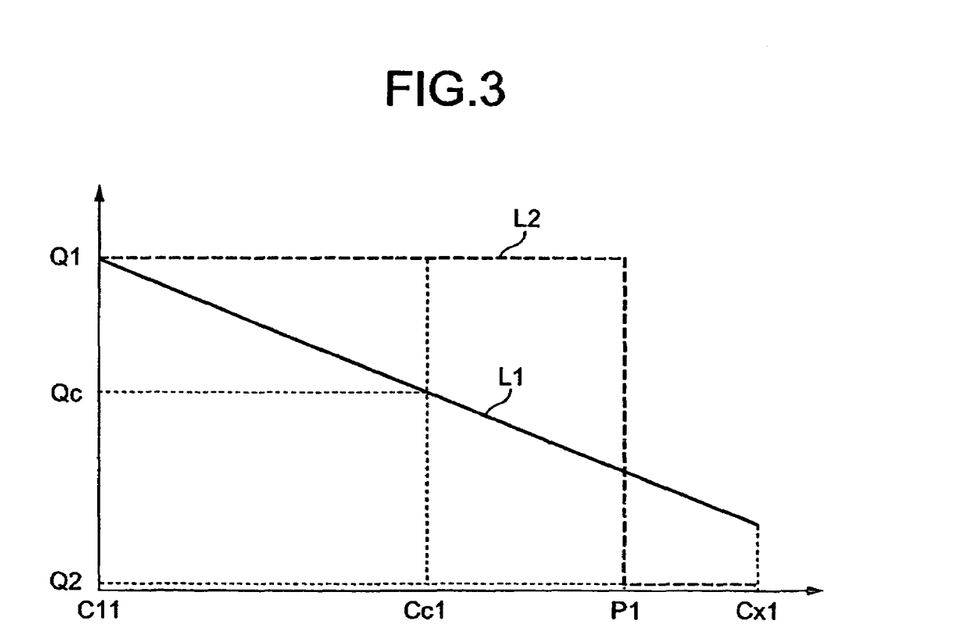
FIG. 3 shows an electric charge quantity stored in a plurality of retention capacitors that are arranged on the selected gate line during a period of time of writing in the inspection step shown in FIG. 2.

Subsequently, during periods of times of writing t1 to d2, the gate driving circuits 12 and 13 may select the gate line G1 from among the plurality of gate lines G1 to Gy to apply the different electric potentials to the selected gate line G1. Specifically, the gate driving circuit 12 may apply the driving electric potential VGH to the pad PL1 of the gate line G1, and the gate driving circuit 13 may apply the retention electric potential VGL to the pad PR1 of the gate line G1. Thereby, the electric potential VPL at the end connected to the pad PL1 of the gate line G1 rises up to the driving electric potential VGH and the electric potential VPR at the end connected to the pad PR1 of the gate line G1 is maintained at the retention electric potential VGL. As a result, the electric potential of the gate line G1 during the period of time of writing is gradually decreased from the side of the pad PL1 to the side of the pad PR1. Due to this voltage reduction, the on-resistances of the plurality of transistors TR11 to TRx1 connected to the gate line G1 are gradually increased from the side of the pad PL1 to the side of the pad PR1. Therefore, as shown by a solid line L1 of FIG. 3, the electric charge quantity stored in each of retention capacitors C11 to Cx1 during the period of time of writing becomes the highest, then, it is gradually decreased to the side of the pad PR 1 and it becomes the lowest at the retention capacitor Cx1.

At the time t2, the gate driving circuit 12 may apply the retention electric potential VGL to the pad PL1. As a result, the electric potential of the entire gate line G1 is maintained at the retention electric potential VGL and the switching transistors Tr11 to Trx1 are turned off.

At the time t3 after a predetermined period of time has passed from the time t2, the inspection equipment 10 may start the reading operation. At the time t3, the gate driving circuits 12 may apply the driving electric potential VGH and may rise up the electric potential VPL to the driving electric potential VGH again. On the other hand, the gate driving circuit 13 may maintain the electric potential VPR at the retention electric potential VGL. Thereby, the transistors TR11 to Trx1 connected to the gate line G1 are turned on.

In addition, during period of times of reading, namely, the times t3 to t4, the switching element 15 may connect the electric charge quantity measuring circuit 14 to the signal line Dc. The electric charge quantity measuring circuit 14 may measure (read) the electric charge written in the retention capacitor Cc1.

After the reading operation, the inspection equipment 10 may start the determining operation. Receiving the electric charge quantity that is measured by the electric charge quantity measuring circuit 14, the determining unit 16 may determine the disconnection failure of the gate line G1. The inspection equipment 10 configured as same as the array board 1 of the inspection target may measure the electric charge quantity of the retention capacitor Cx1 of the array board having the gate line with no disconnection failure in advance and may store the measured electric charge quantity in a memory (not illustrated) within the determining unit 16 as a normal electric charge quantity Qc. The determining unit 16 may compare the electric charge quantity measured by the electric charge quantity measuring circuit 14 to the normal electric charge quantity Qc.

If there is no disconnection failure in the gate line G1, the measured electric charge quantity is equal to the normal electric charge quantity Qc. In this case, the determining unit 16 may determine that the gate line G1 is not disconnected.

On the other hand, when the measured electric charge quantity is higher than the normal electric charge quantity Qc, the determining unit 16 may determine that the gate line G1 is disconnected at any position at the side of the pad PL rather than the side near the gate line G1. For example, in FIG. 1, if the disconnection part is a point P1 at the side of the pad PR1 rather than the side near the signal line Dc, the electric potential from the pad PL1 to the point P1 in the gate line G1 becomes the driving electric potential VGH. On the other hand, the electric potential from the pad P1 to the point PR1 in the gate line G1 becomes the driving electric potential VGL. In this case, the electric charge quantity stored in each retention capacitor is as follows as shown by a broken line L2 of FIG. 3: namely, the charge quantity stored in each retention capacitor arranged from the pad PL1 to the point P1 is an electric charge quantity Q1 and the charge quantity stored in each retention capacitor arranged from the point P1 to the pad PR1 is an electric charge quantity Q2. When the gate line G1 is disconnected at the point P1, the electric charge quantity measured by the electric charge quantity measuring circuit 14 is the electric charge quantity Q1 and this is higher than the normal electric charge quantity Qc. Therefore, the determining unit 16 may determine that the gate line G1 is disconnected at any position at the side of the pad PR1 rather than the side near the signal line Dc.

In the same way, in FIG. 1, if the disconnection part is a point P2 at the side of the pad PL1 rather than the side near signal line Dc, the electric charge quantity of the retention capacitor Cc1 becomes Q2. Therefore, the determining unit 16 may determine that the gate line G1 is disconnected at any position at the side of the pad PL1 rather than the side near signal line Dc.

Due to the above-described operations, even when inspecting the disconnection failure by applying the electric potential to the both ends of the gate line, if the different electric potentials are applied to the both ends, it is possible to inspect the disconnection failure. In this case, if the electric potential is inspected with respect to the retention capacitor within at least one pixel among the pixels connected to the selected gate line, the disconnection failure can be inspected. Further, when the gate line is disconnected, it is possible to specify the place where the disconnection occurs at to some degree.

In the meantime, according to the present embodiment, the inspection is carried out by selecting the gate line G1, however, with respect to the other gate lines G2 to G7, the same inspection is carried out. In addition, according to the present embodiment, the electric charge quantity of the retention capacitor Cc1 located at the center of the gate line G1 is measured by selecting the signal line Dc arranged at the center, however, the same inspection as the above-described inspection can also be carried out also by measuring the electric charge quantity of arbitrary retention capacitor Cx1 arranged on the gate line G1. In this case, if the inspection is carried out by selecting the signal line Dc arranged at the center from among the plurality of signal lines D1 to Dx, it is easiest to determine the disconnection failure because the retention capacitor Cc1 among the plurality of signal lines D1 to Dx has the largest difference of the electric charge quantity (Q1 or Q2) to be stored when the signal line Dc is in a normal case and when the signal line Dc is disconnected.

The above-described inspection equipment 10 inspects the disconnection failures of the gate lines G1 to Gy and also inspects the pixel failure.

Figure 4:
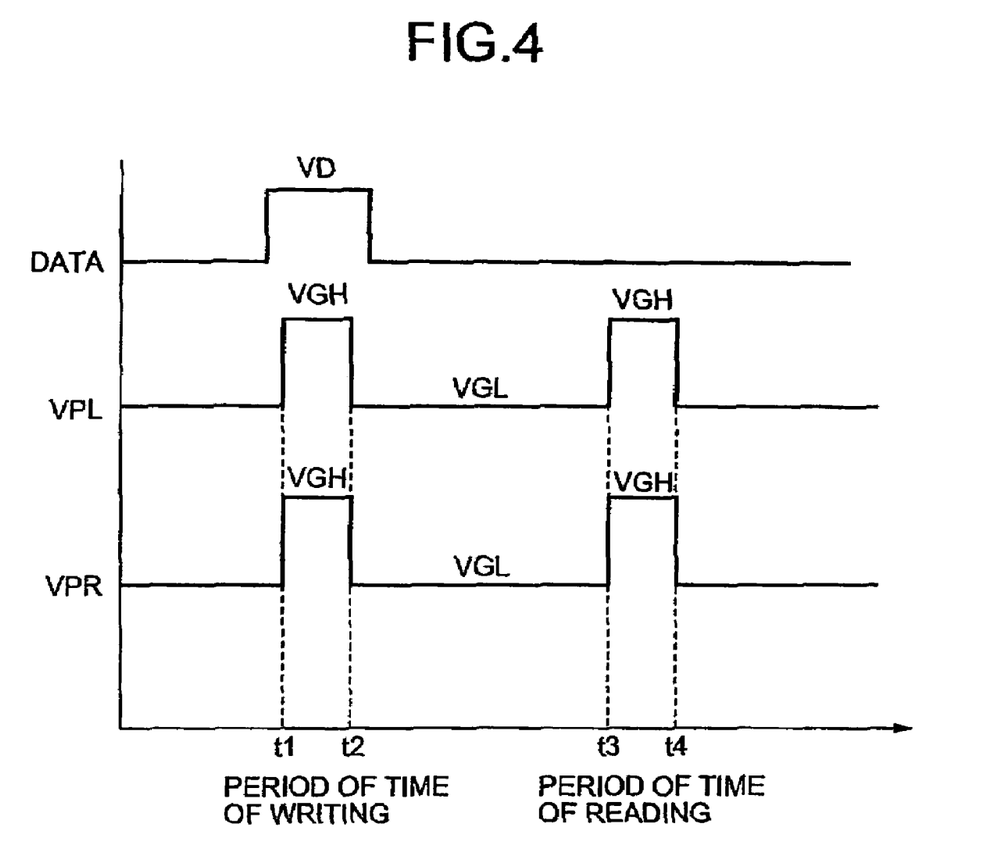
FIG. 4 is a timing chart showing the operation when a pixel failure is inspected by using the inspection equipment shown in FIG. 1.

In the case of the inspection of the pixel failure, as shown in FIG. 4, the electric potentials to be applied to the both ends of the gate line at periods of time of writing t1 to t2 are made equal. During writing, the selecting circuit 131 selects the driving electric potential VGH. Therefore, both of the gate driving circuits 12 and 13 may apply the driving electric potential VGH to the gate line Gy during the period of time of writing. The other operations are same as the inspection of the disconnection failure. In the meantime, the inspection equipment 10 measures the electric charge quantity of the retention capacitor of the normal pixel in advance and stores it in the determining unit 16 as the normal electric charge quantity. The determining unit 16 determines the pixel failure by comparing the measured electric charge quantity to the normal electric charge quantity.

Thereby, a delay of a signal as generated when the driving electric potential VGH is applied only from the one end of the gate line Gy upon the inspection of the pixel failure is not generated. Therefore, the electric charge quantity to be stored in the retention capacitor due to the delay of the signal is not dispersed. Further, the period of time of writing can be short (e.g., 5 to 10 μs). Therefore, so that the inspection accuracy of the pixel failure can be improved.

As described above, the inspection equipment 10 also can inspect the pixel failure by the same structure of the equipment for the inspection of the disconnection failure of the gate line. Therefore, even if the inspection equipment 10 inspects the disconnection failure after the inspection of the pixel failure, there is no need to carry out the operation such as switching of the equipment and there is no workload.

In the meantime, even if the electric charge quantity measured by the electric charge quantity measuring circuit according to the present embodiment includes a coupling capacity of the selected gate line and the selected signal line together with the electric charge quantity of the retention capacitor, it is possible to acquire the same result as the above-described inspection result of the disconnection failure.

In the meantime, the inspection equipment 10 according to the present embodiment can inspect not only the array board used the liquid crystal panel but also the array board used as the organic electro luminescence panel in the same way.

According to the present embodiment, the switching transistor of the array board 1 is defined as an n channel type TFT, however, it may be a p channel type TFT.

According to the inspection method of the gate line according to the present embodiment, the driving electric potential VGH is applied to the one end of the gate line during the period of time of writing and the retention electric potential VGL is applied to the other end thereof, however, also by applying the different electric potentials to the both ends, the disconnection failure of the gate line can be inspected.

In addition, according to the inspection method of the gate line according to the present embodiment, the electric charge quantity is measured by turning off the switching transistor Trxy once after a period of time of writing has passed and turning on the switching transistor Trxy again when a period of time of reading is started, however, the electric charge may be measured with the switching transistor Trxy turned on after storing the electric charge in the retention capacitor Cxy. In this case, just after the writing circuit 11 stops applying of the writing electric potential VD, the switching element 15 connects the electric charge quantity measuring circuit 14 to the signal line Dx.

The embodiment according to the present invention is described as above, however, the above-described embodiment is only an exemplification for practicing the present invention. Therefore, the present invention is not limited to the above-described embodiment and various modifications will become possible without departing from the scope thereof.

The inspection method of the array board and the inspection equipment thereof according to the present invention can be particularly used for the inspection of the array board that is used as the liquid crystal panel or the organic electro luminescence panel.

What is claimed is:

1. An inspection method of an array board which includes a plurality of gate lines arrayed in rows, a plurality of signal lines arrayed in columns and a plurality of pixels each of which is arranged at the intersections of the gate lines with the signal lines, the pixels including switching transistors having control terminals connected to the gate lines and terminals of one side connected to the signal lines, and retention capacitors connected to the terminals of the other side of the switching transistors, the inspection method of the array board comprising the steps of:

selecting a signal line out of a plurality of the signal lines;
applying a writing electric potential to the selected signal line;
selecting a gate line out of a plurality of the gate lines;
turning on the switching transistor arranged at the intersection of the selected signal line with the selected gate line, by applying a first electric potential to the one end of the selected gate line and applying a second electric potential being lower than the first electric potential to the other end of the selected gate line;

measuring the electric charge quantity stored in the retention capacitor through the selected signal line, and determining a disconnection failure of the selected gate line on the basis of the measured electric charge quantity.

2. The inspection method of the array board according to claim 1, wherein the step of determining determines the disconnection failure by comparing the measured electric charge quantity to the normal electric charge quantity that was measured in advance on the array board without the disconnection of the gate line.

3. The inspection method of the array board according to claim 2, wherein the step of determining determines that the disconnection failure is generated at any part at the side of the end to which the second electric potential is applied rather than the side near the selected signal line in the selected gate line when the measured electric charge quantity is higher than the normal electric charge quantity; and the disconnection failure is generated at any part at the side of the end to which the first electric potential is applied rather than the side near the selected signal line in the selected gate line when the measured electric charge quantity is lower than the normal electric charge quantity.

4. The inspection method of the array board according to claim 1, wherein the step of selecting the signal line selects a signal line arranged at a center from among the plurality of signal lines.

5. The inspection method of the array board according to claim 1, further comprising the steps of:

selecting a signal line from among the plurality of signal lines;

applying a writing electric potential to the selected signal line during a period of time of writing;

turning on a switching transistor arranged at the intersection of the selected gate line with the selected signal line by applying the same electric potentials to the both ends of the gate line selected from among the plurality of gate lines during the period of time of writing;

turning on the switching transistor again during a period of time of reading and measuring the electric charge quantity stored in the retention capacitor through the selected signal line; and determining a pixel failure on the basis of the measured electric charge quantity.

6. An inspection equipment of an array board which includes a plurality of gate lines arrayed in rows, a plurality of signal lines arrayed in columns and a plurality of pixels each of which is arranged at the intersections of the gate lines with the signal lines, the pixels including switching transistors having control terminals connected to the gate lines and continuity terminals of one side connected to the signal lines, and retention capacitors connected to continuity terminals of the other side of the switching transistors, the inspection equipment of an array board comprising:

a writing means for selecting a signal line out of a plurality of the signal lines and applying a writing electric potential to the selected signal line;

a driving means for selecting a gate line out of a plurality of the gate lines and applying an electric potential to the selected gate line, and thereby turning on the switching transistor arranged at the intersection of the selected gate line with the selected signal line;

an electric charge quantity measuring means for measuring the electric charge quantity stored in the retention capacitor through the selected signal line, and a determining means for determining a disconnection failure of the selected gate line on the basis of the measured electric charge quantity, the driving means including:

a first gate driving unit for applying a first electric potential to the one end of the selected gate line, and a second gate driving unit for applying a second electric potential being lower than the first electric potential to the other end of the selected gate line.

7. The inspection equipment of the array board according to claim 6, wherein the determining means determines the disconnection failure by comparing the measured electric charge quantity to the normal electric charge quantity that was measured in advance on the array board without disconnection of the gate line.

8. The inspection equipment of the array board according to claim 7, wherein the determining means determines that the disconnection failure is generated at any part at the side of the end to which the second electric potential is applied rather than the side near the selected signal line in the selected gate line when the measured electric charge quantity is higher than the normal electric charge quantity; and the disconnection failure is generated at any part at the side of the end to which the first electric potential is applied rather than the side near the selected signal line in the selected gate line when the measured electric charge quantity is lower than the normal electric charge quantity.

9. The inspection equipment of the array board according to claim 6, wherein the writing means selects a signal line arranged at a center from among the plurality of signal lines.

10. The inspection equipment of the array board according to claim 6, wherein the driving means further comprises a selecting unit for selecting the electric potential applied from the second driving means to the other end of the selected gate line from among the first and second electric potentials; and the determining means further determines a pixel failure on the basis of the measured electric charge quantity when the selecting means selects the first electric potential.

* * * * *